(12) United States Patent
Biegelsen et al.

(10) Patent No.: US 11,098,449 B2
(45) Date of Patent: Aug. 24, 2021

(54) PRE-DRIER APPARATUS AND METHOD

(71) Applicant: Palo Alto Research Center, Palo Alto, CA (US)

(72) Inventors: David K. Biegelsen, Portola Valley, CA (US); Lars-Erik Swartz, Sunnyvale, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 16/733,859

(22) Filed: Jan. 3, 2020

(65) Prior Publication Data

US 2021/0207322 A1   Jul. 8, 2021

(51) Int. Cl.

| D21F 5/18 | (2006.01) |
|---|---|
| F26B 13/10 | (2006.01) |
| D21F 5/00 | (2006.01) |
| H05K 3/22 | (2006.01) |
| F26B 13/08 | (2006.01) |
| B41F 23/04 | (2006.01) |

(52) U.S. Cl.
CPC ............... *D21F 5/18* (2013.01); *D21F 5/004* (2013.01); *F26B 13/10* (2013.01); *B41F 23/0426* (2013.01); *F26B 13/08* (2013.01); *H05K 3/227* (2013.01)

(58) Field of Classification Search
CPC .. D21F 5/18; D21F 5/004; F26B 13/10; F26B 13/08; B41F 23/0426; H05K 3/227
USPC ........................................................ 34/454
See application file for complete search history.

(56) References Cited

U.S. PATENT DOCUMENTS

| 4,321,757 A | * | 3/1982 | van der Blom | D06B 9/06 34/449 |
|---|---|---|---|---|
| 5,046,264 A | * | 9/1991 | Hultzsch | F26B 15/12 34/245 |
| 5,323,546 A | * | 6/1994 | Glover | F26B 3/283 34/267 |
| 5,452,065 A | | 9/1995 | Bell | |
| 5,493,373 A | | 2/1996 | Gundlach et al. | |
| 5,678,323 A | * | 10/1997 | Domingue | F26B 3/30 34/209 |

(Continued)

FOREIGN PATENT DOCUMENTS

| DE | 202015106039 U1 | * | 2/2017 | ............ F26B 21/004 |
|---|---|---|---|---|
| WO | WO-2017081172 A1 | * | 5/2017 | ............... F26B 13/06 |

*Primary Examiner* — Stephen M Gravini
(74) *Attorney, Agent, or Firm* — Caesar Rivise, PC

(57) ABSTRACT

A pre-dryer for continuous feed or cut sheet systems is described. Such a module can be used in various applications, for example, prior to printing where the time constant for fusing and glossing is long enough that the substrate temperature essentially equilibrates with that of the marking material on the surface of the sheet. The pre-dryer may be part of an image forming device. Substrates, including paper, typically have high moisture content in normal atmospheric conditions. Such substrates may have a moisture content of about 10% water by weight, which is considered high for printing. Such high moisture content in image receiving substrates leads to various artifacts and extends heating times to take the substrate to its glossing temperature that are about four times longer than for dry media. This longer heating time translates to undesirably longer paper paths or nip lengths.

20 Claims, 11 Drawing Sheets

(56) References Cited

U.S. PATENT DOCUMENTS

| | | | |
|---|---|---|---|
| 5,743,022 A * | 4/1998 | Hall Taylor | F26B 3/20 |
| | | | 34/68 |
| 5,937,535 A * | 8/1999 | Hoffman, Jr. | F26B 15/18 |
| | | | 34/78 |
| 6,223,451 B1 * | 5/2001 | Satake | F26B 9/087 |
| | | | 34/134 |
| 7,460,822 B2 | 12/2008 | Potter et al. | |
| 10,281,211 B2 * | 5/2019 | Savarese | F26B 17/023 |
| 10,724,794 B2 * | 7/2020 | Niklaus | F26B 21/02 |
| 2003/0150128 A1 * | 8/2003 | Macaluso | F26B 17/045 |
| | | | 34/397 |

* cited by examiner

PRE-DRIER APPARATUS AND METHOD

FIELD OF DISCLOSURE

This disclosure relates generally to electrostatographic image printing devices, and more particularly, to drying a substrate prior to image formation thereon.

BACKGROUND

In electrostatographic printing, commonly known as xerographic printing or copying, an important process step is known as "fusing". In the fusing step of the xerographic process, dry marking making material, such as toner, which has been placed in image-wise fashion on an imaging substrate, such as a sheet of paper, is subjected to heat and/or pressure in order to melt and otherwise fuse the toner permanently on the substrate. In this way, durable, non-smudging images are rendered on the substrates.

The most common design of a fusing apparatus as used in commercial printers includes two rolls, typically called a fuser roll and a pressure, forming a nip therebetween for the passage of the substrate therethrough. Typically, the fuser roll further includes, disposed on the interior thereof, one or more heating elements, which radiate heat in response to a current being passed therethrough. The heat from the heating elements passes through the surface of the fuser roll, which in turn contacts the side of the substrate having the image to be fused, so that a combination of heat and pressure successfully fuses the image as shown, for example, in U.S. Pat. Nos. 5,452,065; 5,493,373; and 7,460,822 B2.

In contactless or hot roll fusing of toner, high moisture content in the substrate medium leads to various artifacts including blistering roll of images and cockling of the substrate. High moisture content also extends heating times to take the media to the glossing temperature due to the large latent heat of water evaporation. The energy can be about four times greater than for dry media. The resultant longer heating time translates to undesirably longer paper paths or nip lengths. These path lengths or associated heating rates vary depending on the weight and moisture content of the media.

SUMMARY

The following presents a simplified summary in order to provide a basic understanding of some aspects of one or more embodiments or examples of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later. Additional goals and advantages will become more evident in the description of the figures, the detailed description of the disclosure, and the claims.

The foregoing and/or other aspects and utilities embodied in the present disclosure may be achieved by pre-drying a substrate before simplex or duplex printing that may avoid problems such as blistering and cockling and minimize the heating times and energies required during subsequent fusing steps. Variable amounts of pre-drying can be achieved by varying the path length through the pre-dryer or varying the heating rate within a fixed path length.

According to aspects described herein, a pre-dryer for drying an image receiving substrate in preparation for a subsequent printing thereon includes an oven, endless porous belts, and belt rolls. The oven has an inlet through which the image receiving substrate to be dried is passed, and an outlet downstream the inlet through which the image receiving substrate exits the oven as a dried image receiving substrate. Two separate endless porous belts recirculate within the oven and sandwich the image receiving substrate along a path length between the inlet and the outlet, with a first one of the porous belts maintaining contact with a first side of the image receiving substrate between the inlet and the outlet, and a second one of the porous belts maintaining contact with a second side of the image receiving substrate between the inlet and the outlet, the path length representing a length where the two separate porous belts remain adjacent to sandwich the image receiving substrate therebetween. The belt rolls are configured for the porous belts to wind around them within the oven. The belt rolls tension the porous belts during their recirculation and carry the sandwiched image receiving substrate along the path length to the outlet. The oven heats the porous belts and image receiving substrate within the oven while the image receiving substrate is sandwiched between the porous belts to dry the image receiving substrate to a desired level in preparation for a subsequent printing thereon.

According to aspects illustrated herein, a method for pre-drying an image receiving substrate with a pre-dryer includes recirculating the two separate endless porous belts within the oven, the porous belts sandwich the image receiving substrate along a path length between the inlet and the outlet, with the first one of the porous belts maintaining contact with the first side of the image receiving substrate between the inlet and the outlet, and the second one of the porous belts maintaining contact with the second side of the image receiving substrate between the inlet and the outlet. The path length represents the length where the two separate porous belts remain adjacent to sandwich the image receiving substrate therebetween. The method also includes carrying the sandwiched image receiving substrate along the path length to the outlet via the plurality of belt rolls about which the porous belts wind within the oven, with the belt rolls configured to tension the porous belts during their recirculation, and heating the porous belts and image receiving substrate within the oven while the image receiving substrate is sandwiched between the porous belts with a heat source to dry the image receiving substrate to a desired level in preparation for a subsequent printing thereon.

According to aspects described herein, a pre-dryer for drying an image receiving substrate in preparation for a subsequent printing thereon includes two separate endless porous belts and belt rolls within an oven. The two separate endless porous belts recirculate within the oven, with the oven having an inlet through which the image receiving substrate to be dried is passed and an outlet downstream the inlet through which the image receiving substrate exits the oven as a dried image receiving substrate. The porous belts sandwich the image receiving substrate along a path length between the inlet and the outlet, with a first one of the porous belts maintaining contact with a first side of the image receiving substrate between the inlet and the outlet, and a second one of the porous belts maintaining contact with a second side of the image receiving substrate between the inlet and the outlet. The path length represents a length where the two separate porous belts remain adjacent to sandwich the image receiving substrate therebetween. The porous belts wind within the oven around the belt rolls, with the belt rolls configured to tension the porous belts during their recirculation and carry the sandwiched image receiving substrate along the path length to the outlet. The plurality of belt rolls are arranged as an array of belt rolls having a plurality of columns, with the plurality of columns including outer columns adjacent opposite sidewalls of the oven and at least one inner column between the outer columns. The porous belts and image receiving substrate are heated within the oven while the image receiving substrate is sandwiched between the porous belts to dry the image receiving substrate to a desired level in preparation for a subsequent printing thereon.

Exemplary embodiments are described herein. It is envisioned, however, that any system that incorporates features of apparatus and systems described herein are encompassed by the scope and spirit of the exemplary embodiments.

BRIEF DESCRIPTION OF THE DRAWINGS

Various exemplary embodiments of the disclosed apparatuses, mechanisms and methods will be described, in detail, with reference to the following drawings, in which like referenced numerals designate similar or identical elements, and.

DETAILED DESCRIPTION

Figure 1:
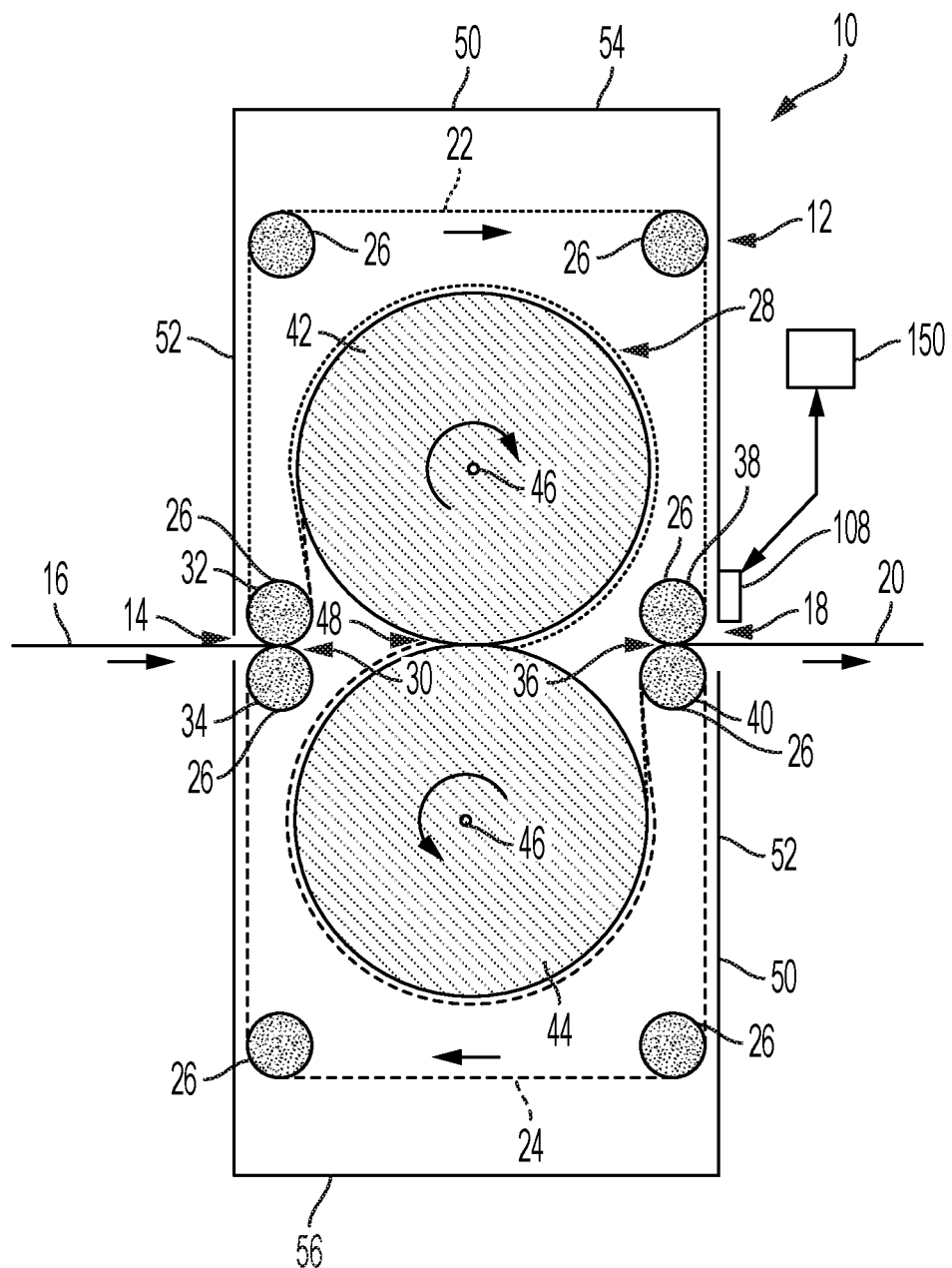
FIG. 1 illustrates an exemplary pre-dryer for drying an image receiving substrate in accordance with examples of the embodiments.

Illustrative examples of the devices, systems, and methods disclosed herein are provided below. An embodiment of the devices, systems, and methods may include any one or more, and any combination of, the examples described below. This invention may, however, be embodied in many different forms and should not be construed as limited to the embodiments set forth below. Rather, these exemplary embodiments are provided so that this disclosure will be thorough and complete, and will fully convey the scope of the invention to those skilled in the art. Accordingly, the exemplary embodiments are intended to cover all alternatives, modifications, and equivalents as may be included within the spirit and scope of the apparatuses, mechanisms and methods as described herein.

We initially point out that description of well-known starting materials, processing techniques, components, equipment and other well-known details may merely be summarized or are omitted so as not to unnecessarily obscure the details of the present disclosure. Thus, where details are otherwise well known, we leave it to the application of the present disclosure to suggest or dictate choices relating to those details. The drawings depict various examples related to embodiments of illustrative methods, apparatus, and systems for pre-heating a substrate before printing thereon.

When referring to any numerical range of values herein, such ranges are understood to include each and every number and/or fraction between the stated range minimum and maximum. For example, a range of 0.5-6% would expressly include the endpoints 0.5% and 6%, plus all intermediate values of 0.6%, 0.7%, and 0.9%, all the way up to and including 5.95%, 5.97%, and 5.99%. The same applies to each other numerical property and/or elemental range set forth herein, unless the context clearly dictates otherwise.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

The terms "print medium", "web", "web substrate", "print substrate" and "substrate sheet" generally refers to a usually flexible physical sheet of paper, polymer, Mylar material, plastic, or other suitable physical print medium in singular or substrates, sheets, webs, or other suitable physical print media in plural form, for images, whether precut or web fed. The listed terms "media", "print media", "print substrate" and "print sheet" may also include woven fabrics, non-woven fabrics, metal films, carbon fiber reinforced material and foils, as readily understood by a skilled artisan.

The term "image receiving substrate" generally refers to a print media that is usually flexible, sometimes curled, physical sheet of paper, plastic, or other suitable physical print media substrate for images, whether precut or web fed.

The term "marking material" as used herein may refer to printing matter deposited by an image forming device onto a substrate to form an image on the substrate. The listed term "marking material" may include inks, toners, metal particles, plastics, pigments, powders, molten materials, polyamide, nylon, glass filled polyamide, epoxy resins, bio-based resins, wax, graphite, graphene, carbon fiber, photopolymers, polycarbonate, polyethylene, Polylactic acid (PLA), Polyvinyl alcohol (PVA), ABS filament, high-density polyethylene (HDPE), high impact polystyrene (HIPS), Polyethylene terephthalate (PETT), ceramics, conductive filament and other ink jet materials.

The term 'image forming device", "printing device" or "printer" as used herein encompasses any apparatus that performs a print outputting function for any purpose, such as a digital copier, scanner, image printing machine, xerographic device, digital production press, document processing system, image reproduction machine, bookmaking machine, facsimile machine, multi-function machine, or the like and can include several marking engines, feed mechanism, scanning assembly as well as other print media processing units, such as paper feeders, finishers, and the like. An image forming device can handle sheets, webs, marking materials, and the like. An image forming device can place marks on any surface, and the like and is any machine that reads marks on input sheets; or any combination of such machines. It will be understood that the structures depicted in the figures may include additional features not depicted for simplicity, while depicted structures may be removed or modified.

The term "controller" is used herein generally to describe various apparatus relating to the operation of one or more device that directs or regulates a process or machine. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

A pre-dryer for continuous feed or cut sheet systems is described. Such a module can be used in various applications, for example, prior to printing where the time constant for fusing and glossing is long enough that the substrate temperature essentially equilibrates with that of the marking material on the surface of the sheet (dwell time >~0.1 sec.). The pre-dryer may be part of an image forming device (e.g., electrostatographic printer). The inventors found that substrates, including paper, typically have high moisture content in normal atmospheric conditions. Such substrates may have a moisture content of about 10% water by weight, which is considered high for printing. Such high moisture content in image receiving substrates leads to various artifacts and extends heating and power consumption to take the substrate rapidly to the glossing temperature (e.g., above 100° C.) that are about four times longer than for dry media (e.g., under 1% water). This longer heating time translates to undesirably longer paper paths or nip lengths or peak power availability.

FIG. 1 depicts an exemplary pre-dryer 10 for drying an image receiving substrate in preparation for a subsequent printing thereon. The pre-dryer 10 includes an oven 12, which is understood to refer to a chamber used for baking, heating, or drying. The oven 12 includes an outer shell with apertures defining an inlet 14 through which an image receiving substrate 16 to be dried may enter the oven, and an outlet 18 downstream the inlet through which the image receiving substrate may exit the oven as a dried image receiving substrate 20. The image receiving substrate 16 may be sheet web or cut sheets as understood by a skilled artisan.

Within the oven 12, two separate endless porous belts 22, 24 may be seen recirculating around a plurality of belt rolls 26. Each belt 22, 24 is typically wider than the image receiving substrate 16 and recirculates within the oven 12 to sandwich the image receiving substrate along a sandwiched path length 28 between the inlet 14 and the outlet 18. At different points along the respective recirculation paths of the belts, each belt may be close to each other (e.g., along the sandwiched path length 28 from the inlet 14 to the outlet 18) or spatially apart from each other (e.g., along the recirculation path from the outlet to the inlet). When the belts 22, 24 are close to each other along the sandwiched path length 28 of the recirculation path from the inlet 14 to the outlet 18, the belts may sandwich the image receiving substrate between the belts, with belt 22 maintaining contact with a first side of the image receiving substrate, and belt 24 maintaining contact with a second side of the image receiving substrate. The belts 22, 24 may be adjacent each other sandwiching the image receiving substrate 16 along the path length 28 representing the sandwiched extent of the belts from the inlet 14 to the outlet 18 of the oven 12. In particular, this path length 28 may begin near the inlet 14 at a nip 30 between belt rolls 32 and 34 with the rolls rotating in opposite directions away from the inlet to bring the image receiving substrate 16 between the belts 22, 24. The path length ends near the outlet 18 at a nip 36, between belt rolls 38 and 40 with the rolls rotating in opposite directions towards the outlet for passage of the image receiving substrate out of the oven 12. As can be seen in FIG. 1, the belt rolls are configured to tension the belts 22, 24 during their recirculation and carry the sandwiched image receiving substrate 16 along the path length from the inlet to the outlet. Any of the belt rolls 26 may be driven (e.g., by a motor (not shown)).

In examples, the belts and/or the image receiving substrate may include perforated margins located, for example, near their periphery. In such examples, belt rolls 26 may have sprocket pins on a fixed pitch matching holes in the perforated margins to capture and advance the belts and image receiving substrate through the oven 12.

The belt rolls 26 may have different dimensions and are not limited to particular dimensions. The belt rolls may be made of a metal, ceramic, plastic, or other material understood to be steady enough to keep the belts 22, 24 taught as the belts recirculate within the oven 12. Further, the belt rolls 26 may have a solid outer cylindrical wall, or the outer wall may be porous. In addition, some of the belt rolls may be substantially larger or smaller than other belt rolls.

Some of the belt rolls 26 may be heated. FIG. 1 shows the belt rolls 26 including heater drums 42, 44 having longitudinal axis 46 arranged vertically to form an internal column of rollers. The heater drums may be proximate each other to form a nip 48 with the porous belts traversing from around heater drum 42 to around heater drum 44. The heater drums may also be spatially separated from each other. As can be seen in FIG. 1, the oven 12 includes belt rolls arranged in a plurality of vertical columns, with belt rolls 32, 34 and 26 proximate the left side of the oven being an outer column, belt rolls 38, 40 and 26 proximate the right side of the oven being another outer column, and heater drums 42, 44 being the internal column of rollers.

The image receiving substrate 16 is fed in web form or cut sheets around the heater drums 42, 44 by the recirculating porous belts 22, 24. It is understood that if the image receiving substrate is a continuous fed web, then at least one of the recirculating porous belts 22, 24 may not be needed. The heater drums may be internally heated (e.g., by superheated steam, heating element, heat resistor, lamp, resistive trace) and in turn heat the porous belts and sandwiched image receiving substrate. The heater drums 42, 44 may also be porous, with superheated steam evolving through the heated belt roll to the sandwiched preprinted image receiving substrate 16. Water vapor evolved from the image receiving substrate 16 may be carried away by a recirculated cross flow. For example, hot dry air may enter the oven below the figure plane, flow past the rollers and belts, and exit above the figure plane. The exiting hot air can be dehumidified and returned to the oven as relatively dry air. This hot dry air, which may come from a heat source, may be another source of heat to dry the image receiving substrate. In examples this may be the only source of heat. If the image receiving substrate 16 is heated (e.g., to ~200° C.), the water vapor pressure inside the image receiving substrate is also raised (e.g., to >15 atmospheres). Thus, even recirculating moist air or pure steam in the oven at atmospheric pressure will allow rapid drying of the image receiving substrate.

A heat source heats the porous belts 22, 24 and image receiving substrate 16 within oven shell walls 50 while the image receiving substrate is sandwiched between the porous belts to dry the image receiving substrate to a desired level in preparation for a subsequent printing thereon. Heat may be provided within the oven 12 via, for example, superheated steam, hot air, radiation, conduction, convection or some other heating approach. While not being limited to a particular theory, the heat source may be a heating element or source of heat provided in or to the oven interior, as understood by a skilled artisan. The heat may be in the form of steamed or superheated steamed moisture internal to heater drums or released from elsewhere in the oven. Oven shell walls 50 may help to isolate the heat within the oven to heat the porous belts 22, 24 and image receiving substrate 16. The oven shell walls include side walls 52, a top wall 54 defining a top border of the oven 12, and a bottom wall 56 defining a bottom border of the oven 12.

Still referring to FIG. 1, the image receiving substrate 16 may be heated and dried within the oven 12 by entering the inlet 14. The image receiving substrate may then be carried by the porous belts 22, 24 at the nip 30 between belt rolls 32 and 34 with the rolls rotating away from the inlet to bring the image receiving substrate 16 between the belts 22, 24. The image receiving substrate 16 continues between the belt rolls 32, 34—traversing first clockwise around heater drum 42 and then counter-clockwise around heater drum 44, with the heater drums in this example heating the belt rolls and drying the substrate sandwiched therebetween. Accordingly, two of the belt rolls 26 (e.g., heater drums 42 and 44) are near each other and rotate in opposite directions with the porous belts 22, 24 rotating about and between the two belt rolls for even heating of both porous belts and the sandwiched preprinted image receiving substrate 16. The dried sandwiched substrate is then carried around belt roll 40 and through the nip 36 between belt rolls 38 and 40 rotating towards the outlet 18 for exit out of the oven through the outlet. The belt rolls 22, 24 separate at nip 36 and each circulate around respective belt rolls 26 located near the periphery of the oven shell walls 50 back to their rejoin at nip 30.

The pre-dryer 100 may also include moisture sensors 108 downstream the output 18. The sensors 108 may be configured to measure the moisture level of the dried image receiving substrate 20 exiting the oven 12. The sensors 108 measurements may be fed back or communicated via wired or wireless communication to a controller 150 adapted to adjust the speed of the driven belt rolls or shift the belt rolls to adjust the drying time that the porous substrate is in the oven. For example, based on the moisture measurements taken of the dried image receiving substrate 20 exiting the oven 12, the driven belt rolls 26 may speed up or slow down as needed to sufficiently dry the substrate 16 in a minimal time. In addition, the heating power or cross-flow speed may be adjusted to provide a desired level of moisture removal to obtain the desired moisture content in the exiting image receiving substrate.

Figure 2A:
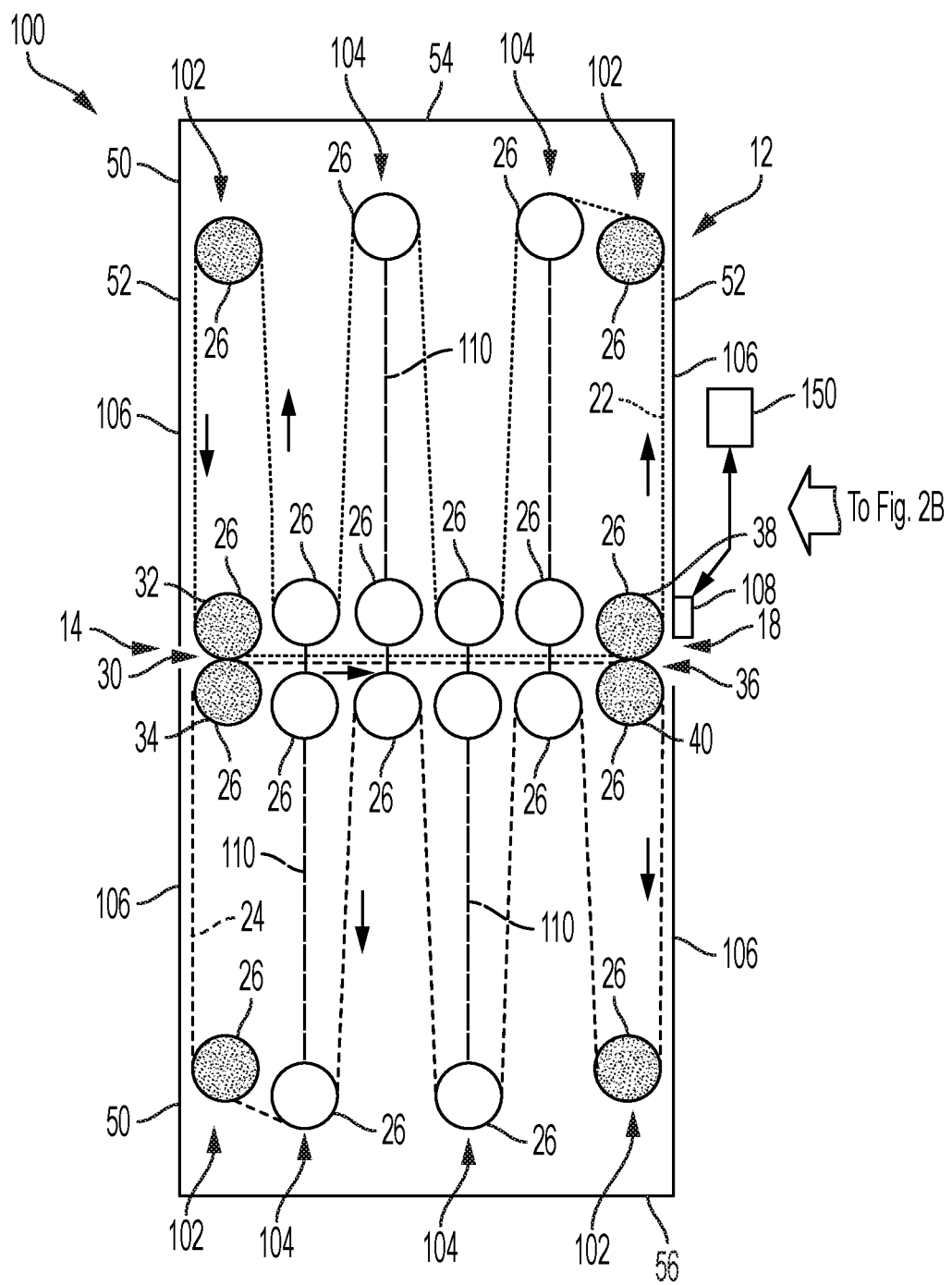
FIGS. 2A and 2B illustrate another exemplary pre-dryer for drying an image receiving substrate in accordance with examples of the embodiments.
Figure 2B:
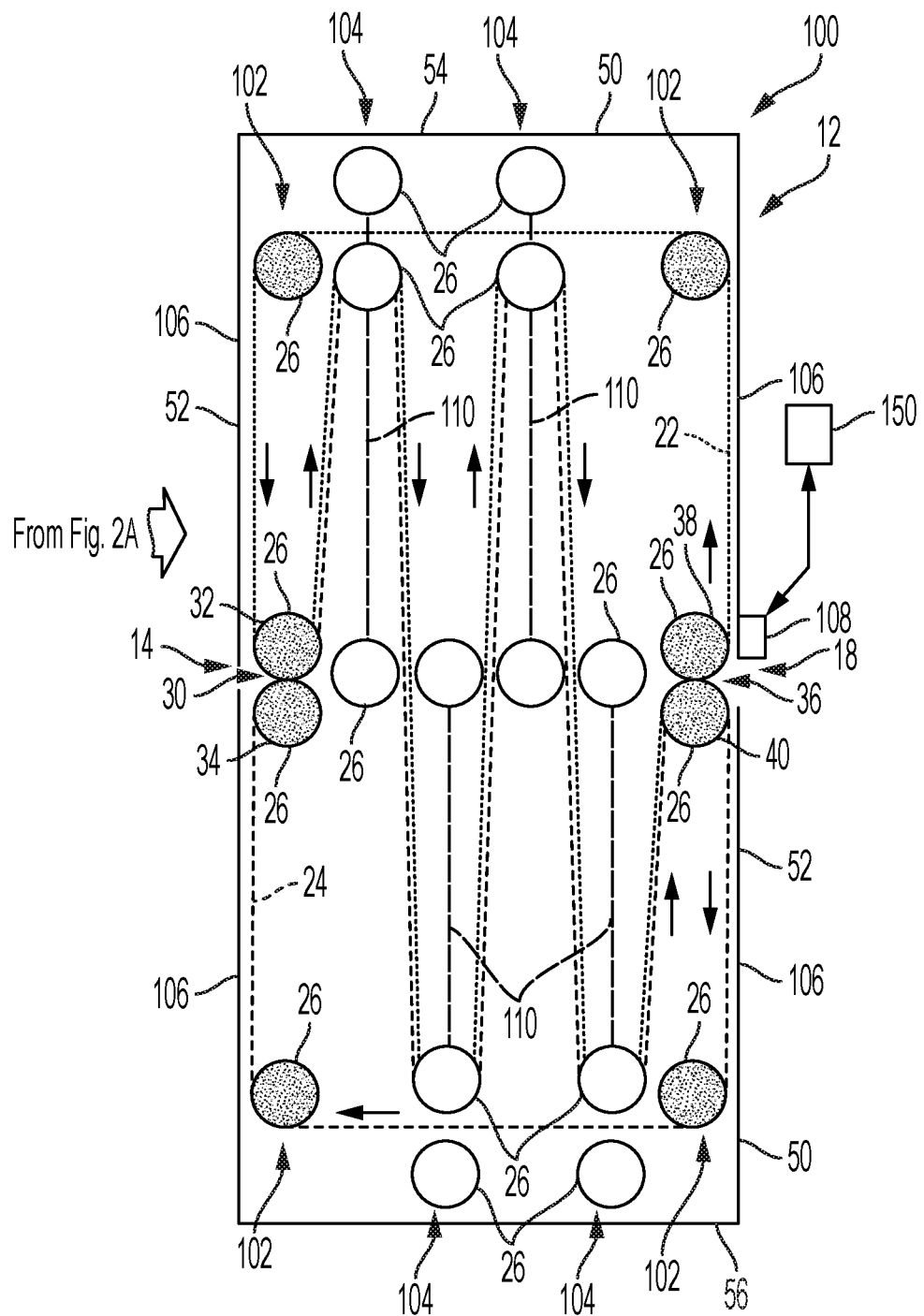

FIGS. 2A and 2B depict another exemplary pre-dryer 100 for drying an image receiving substrate 16 in preparation for a subsequent printing thereon. The pre-dryer 100 is similar to the pre-dryer 10 discussed above, and includes the oven 12 having outer shell walls 50 with apertures defining inlet 14 and outlet 18. The image receiving substrate 16 (FIG. 1) to be dried may enter the oven 12 via passage through inlet 14, and exit the oven as dried image receiving substrate 20 via the outlet 18 downstream the inlet. Again two porous belts 22, 24 may carry image receiving substrate 16 as unmarked cut sheets or web entering from the left through inlet 14 into the oven 12, which in examples may have cross flowing recirculated hot air or superheated steam. As in FIG. 1, heat may be provided within the oven 12 via, for example, hot steam, hot air, radiation, conduction, convection or some other heating approach as understood by a skilled artisan.

The oven 12 in the example shown in FIG. 2 includes vertically disposed columns of belt roll sets, here identified as outer columns 102 and inner columns 104. In other words, the belt rolls 25 are shown arranged as an array of belt rolls having vertically arranged columns, with outer columns 102 adjacent opposite sidewalls 106 of the oven 12 and inner columns 104 between the outer columns. Any of the belt rolls 26 in the outer columns 102 may be driven (e.g., by a motor (not shown)). The belt rolls 26 in the inner column roll sets may be idler rolls, although the scope is not limited thereto. Any of the belt rolls 26 may also be internally heated (e.g., by superheated steam, heating element, heat resistor, lamp, resistive trace) and in turn heat the porous belts 22, 24 and sandwiched image receiving substrate 16.

Dashed lines 110 between belt rolls of respective inner columns 104 indicate that sets of vertically disposed belt rolls (e.g., three rolls) may be physically linked and can be shifted vertically to vary the length of the paper path. FIG. 2A shows the vertical wheel sets in a position producing minimum sandwiched path length 28 through the oven. For example, upon entering the inlet 14, the image receiving substrate 16 may then be carried by the porous belts 22, 24 at the nip 30 between belt rolls 32 and 34 with the rolls rotating away from the inlet to bring the image receiving substrate 16 between the belts 22, 24. The image receiving substrate 16 continues between the belts inside the oven, where the substrate is heated and dried, and through the nip 36 between belt rolls 38 and 40 rotating towards the outlet 18 for exit out of the oven through the outlet. This configuration can be used for media needing minimal drying, and therefore minimal power consumption to maintain the oven interior and recirculated fluid therein at a constant temperature. The belt roll arrangement in this configuration can also be utilized for pre-feeding a web, or for ease of jam clearance.

FIG. 2B depicts an exemplary belt roll arrangement for maximum sandwiched path length. The total dwell path length in the oven 12 may be continuously varied from minimal sandwiched path length shown in FIG. 2A to a maximum sandwiched path length shown in FIG. 2B by varying the number and shift extent of the meandering inner column belt roll sets. This enables a variable dwell time in the oven associated with variable path length, even when transport speed associated with the porous belt speed is relatively fixed.

As can be seen in FIGS. 2A and 2B, the inner columns 104 of belt rolls may be shifted (e.g., vertically via one or more motors (not shown)) to vary the sandwiched path length 28 where the belts 22, 24 are adjacent each other to sandwich an image receiving substrate 16 therebetween along the path length 28 of the belts from the inlet 14 to the outlet 18 of the oven 12. It is understood that the shifting of the belt rolls 26 without complete compensation using the additional moving rollers above may involve an increase or decrease of the total length of the belts 22, 24. For example, the total length of the belts is greater in FIG. 2B than in FIG. 2A due to the different belt roll arrangements if belt rolls 26 are not shifted in a compensatory manner. Accordingly, the recirculating porous belts could be made stretchable in association with shifting of the belt rolls.

The pre-dryers may also include moisture sensors 108 downstream the output 18 to measure the moisture level of the dried image receiving substrate 20 exiting the oven 12. The sensors 108 measurements may be fed back or communicated via wired or wireless communication to a controller 150 adapted to adjust the speed of the driven belt rolls or shift the belt rolls to adjust the drying time that the porous substrate is in the oven. Based on the moisture measurements taken of the dried image receiving substrate 20 exiting the oven 12, the sandwiched path length 28 may be increased or decreased as needed to sufficiently dry the substrate, possibly while also minimizing the sandwiched path length or time necessary to dry the substrate. For example, if the sensors 108 detect that the image receiving substrate 20 exiting the oven has a moisture content greater than a desired % by weight (e.g., 1%, 2%, 3%, etc.), then inner columns 104 of belt rolls may be shifted via the controller 150 or a person to lengthen the sandwiched path length 28. Such shifting may resemble shifting at least one of the inner columns 104 as shown from FIG. 2A to FIG. 2B, for example, where the belt rolls in the inner column 104 closest to the left-side outer column 102 are shifted vertically upwards to lengthen the sandwiched path length 28. Further, if the sensors 108 detect that the image receiving substrate 20 exiting the oven has a moisture contact equal to or less than a desired % by weight (e.g., 1%, 2%, 3%, etc.), then inner columns 104 of belt rolls may be shifted automatically via the controller 150 and motor (not shown) or a person to shorten the sandwiched path length 28 for efficiency in an effort to minimize the porous substrate dry time while keeping the measured moisture content of the dried image receiving substrate 20 at the desired level. Such shifting may resemble shifting at least one of the inner columns 104 as shown from FIG. 2B to FIG. 2A.

While it is understood that the belts 22, 24 may be stretchable as needed to accommodate shifting of belt rolls 26, in examples the belts may not be stretchable or minimally stretchable to avoid or minimize deleterious forces on the image receiving substrate 16 if the belt lengths are changed while the image receiving substrate is captured between belts 22, 24. In examples where the belts may not be stretchable, belt rolls 26 in the outer columns 102 distal to the inlet 14 and outlet 18 may shift towards or away from the oven shell walls 50 as needed to maintain belt tautness and maintain belt length in the oven 12 regardless of any inner column 104 belt roll 26 shifting.

Figure 3A:
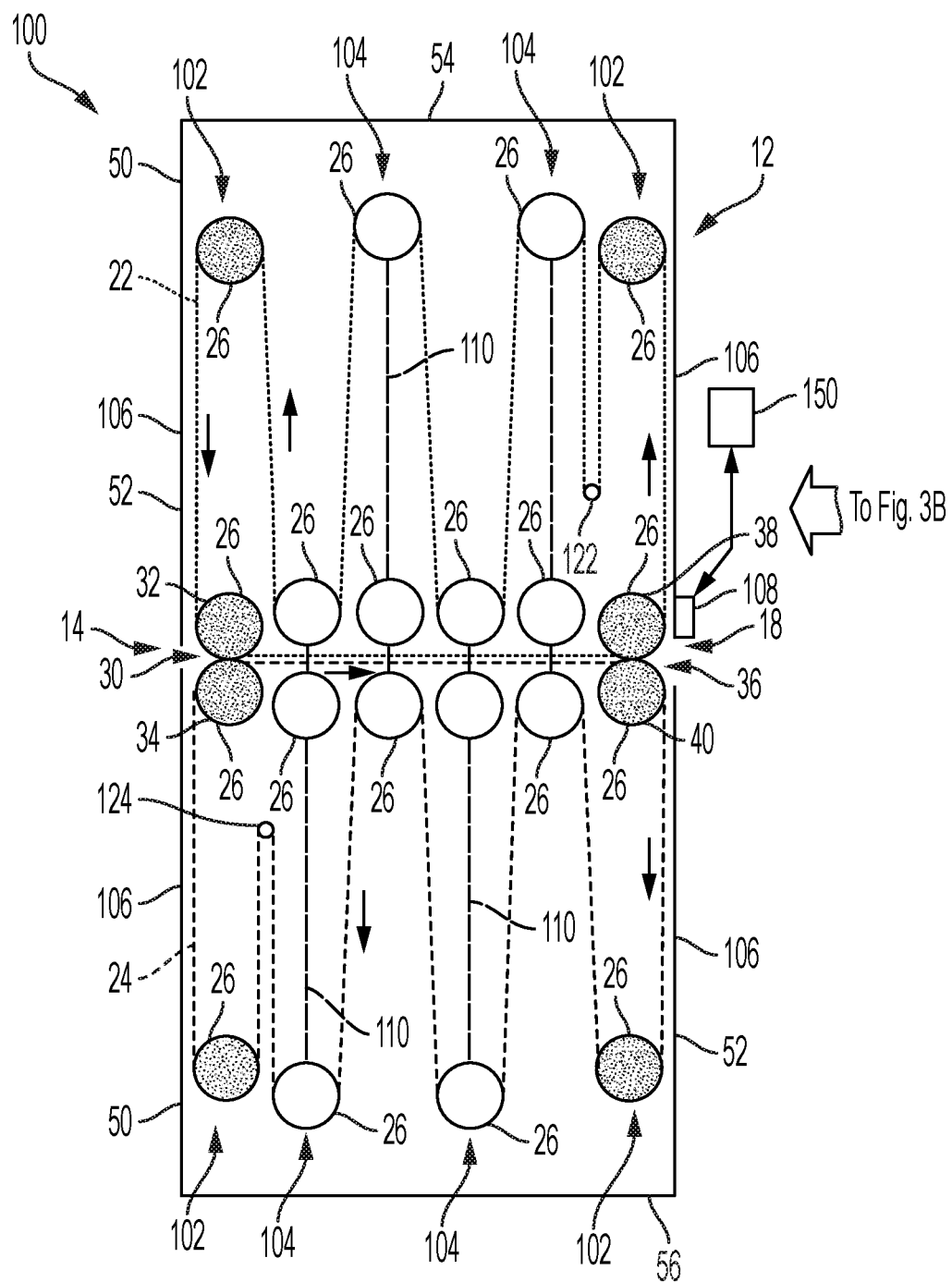
FIGS. 3A and 3B illustrate yet another exemplary pre-dryer for drying an image receiving substrate in accordance with examples of the embodiments.
Figure 3B:
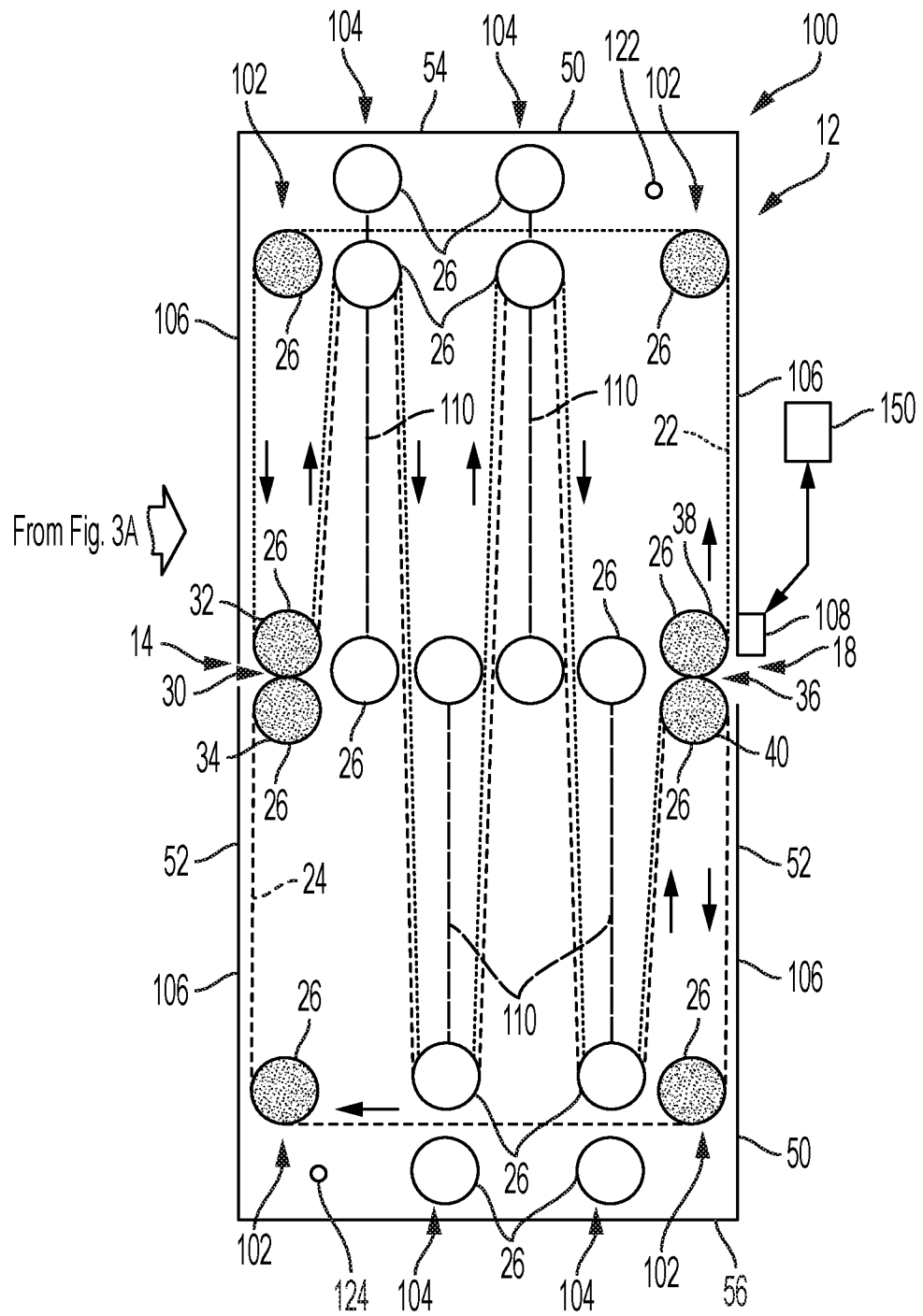

FIGS. 3A and 3B depict another example where belts 22, 24 can be non-stretchable. In FIGS. 3A and 3B, exemplary pre-dryer 120 is shown substantially like the pre-dryer 100 depicted in FIGS. 2A and 2B. In addition, the pre-dryer 120 includes tension rollers 122, 124, with porous belt 22 wound about tension roller 122 and porous belt 24 wound about tension roller 124. The tension rollers 122, 124 may shift as needed to ensure the belts 22, 24 remain taut regardless of the locations of the belt rolls 26. For example, tension rollers may shift vertically as inner column 104 belt rolls 26 shift to change the sandwiched path lengths 28 for extended or shortened drying exposure of the image receiving substrate 16 in the oven 12. Referring to FIG. 3A, the tension roller 122 is shown proximal to belt roll 38 and distal the top wall 54. Accordingly, a large amount of porous belt 22 is shown between the right side outer column 102 and the adjacent inner column 104 where the belt loops down and around tension roller 122. Likewise, the tension roller 124 is shown proximal to belt roll 34 and distal the bottom wall 56, with a large amount of porous belt 24 between the left side outer column 102 and the adjacent inner column 102 where the belt loops up and around the tension roller 124.

The total length of the belts is greater in FIG. 2B than in FIG. 2A due to the different belt roll arrangements. In FIGS. 3A and 3B, the tension rollers 122, 124 account for different belt arrangements, for example, by shifting as the belt rolls 26 in the inner columns 104 shift vertically. In FIG. 3B, the belt rolls 26 are arranged to maximize the sandwiched path lengths 28. This arrangement also requires a greater porous belt length. To accommodate the greater belt length requirement, the tension rollers 122, 124 are shown shifted towards the top wall 54 and the bottom wall 56, respectively. Here, a short amount of porous belt 22 is shown between the right side outer column 102 belt roll 26 and the adjacent inner column 104 belt roll proximate the top wall 54. Likewise, a short amount of porous belt 24 is shown between the right side outer column 102 belt roll 26 and the adjacent inner column 104 belt roll proximate the bottom wall 56.

Figure 4A:
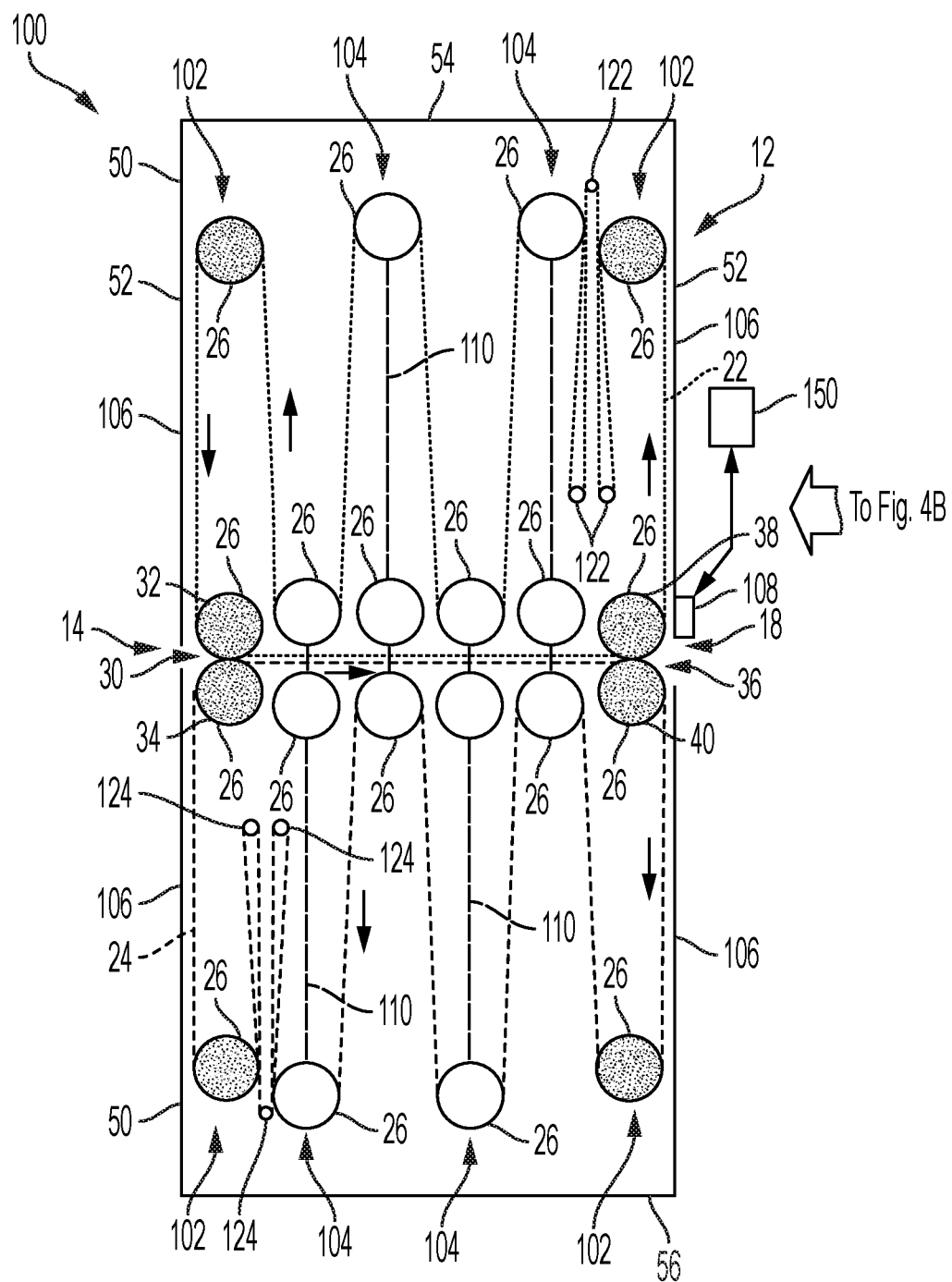
FIGS. 4A and 4B illustrate still another exemplary pre-dryer for drying an image receiving substrate in accordance with examples of the embodiments.
Figure 4B:
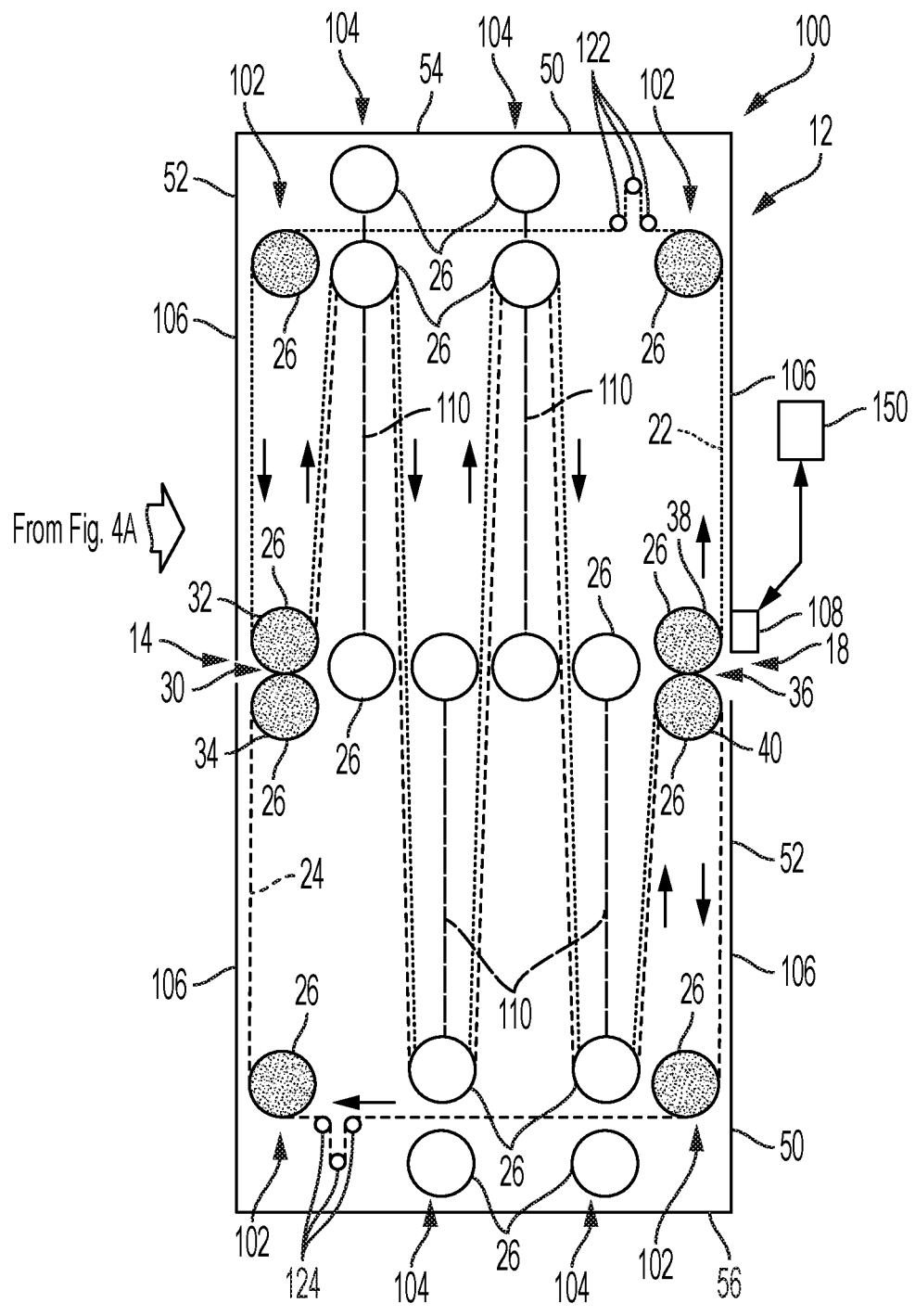

FIGS. 4A and 4B depict yet another example where belts 22, 24 may not be stretchable. In FIGS. 4A and 4B, exemplary pre-dryer 130 is shown substantially like the pre-dryer 120 depicted in FIGS. 3A and 3B. Further, the pre-dryer 130 includes additional tension rollers 122, 124 with porous belt 22 wound about each tension roller 122 and porous belt 24 wound about each tension roller 124. The tension rollers 122, 124 may shift as needed to ensure the belts 22, 24 remain taut regardless of the locations of the belt rolls 26. In addition, with the additional tension rollers, more porous belt 22, 24 slack may be taken up via winding around the plurality of tension rollers. For example, the middle tension rollers shown in FIGS. 4A and 4B can be seen further separate from the left and right tension rollers to take up to at least double the porous belt slack as the single tension rollers depicted in FIGS. 3A and 3B. In other words, the left-right roller pairs in FIG. 4 shift also respective to the higher tension roller 122 and lower tension roller 124, respectively, and can thus accommodate at least twice the belt length compensation as the single tension rollers 122, 124 shown in FIGS. 3A and 3B. Further, the sizes of the belt rolls 26 and tension rollers 122, 124 may be modified, and their spatial relationship modified, as needed to ensure the belts 22, 24 do not rub against themselves while winding about the rolls and rollers.

Figure 5A:
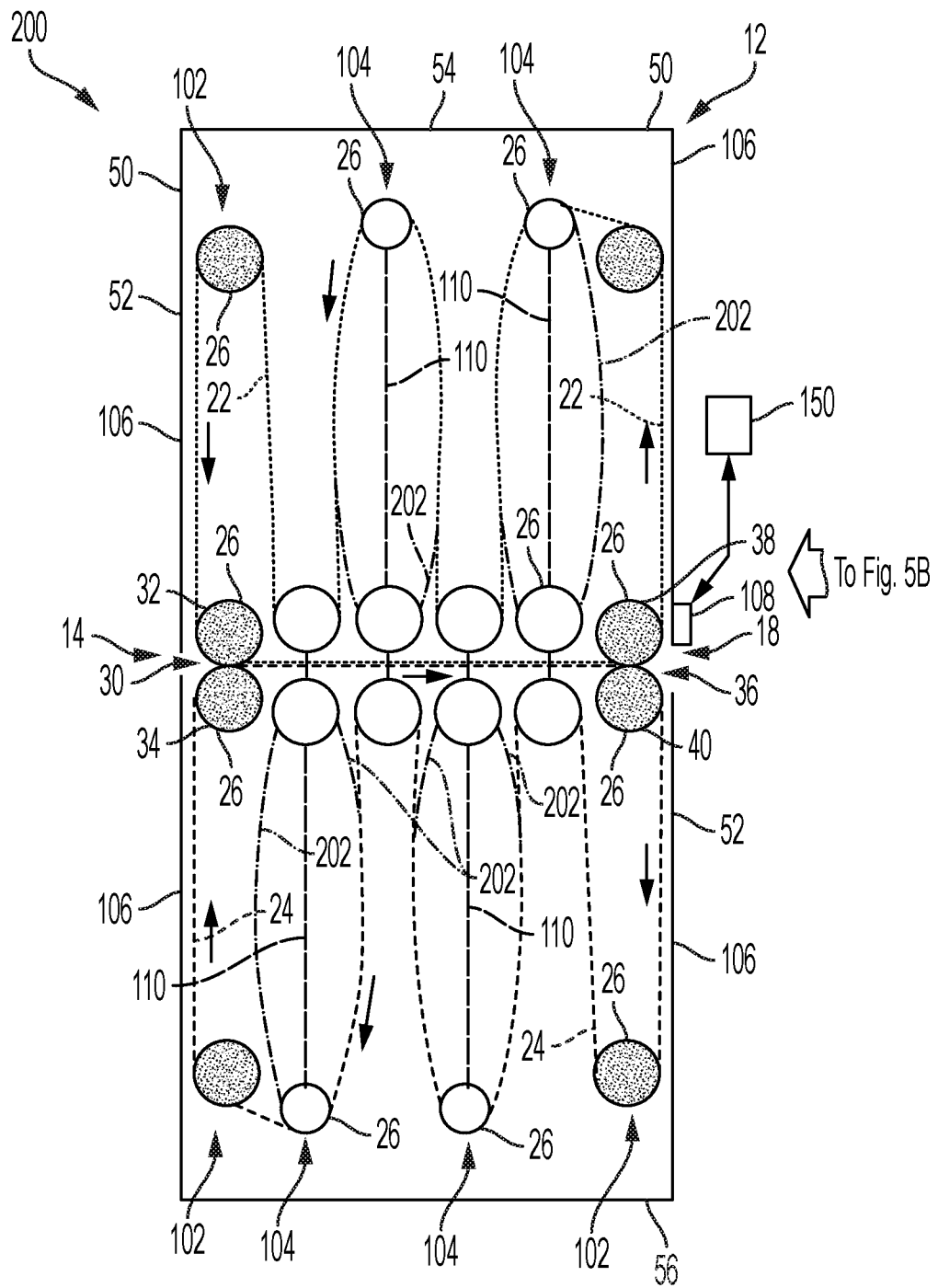
FIGS. 5A and 5B illustrate yet still another exemplary pre-dryer for drying an image receiving substrate in accordance with examples of the embodiments.
Figure 5B:
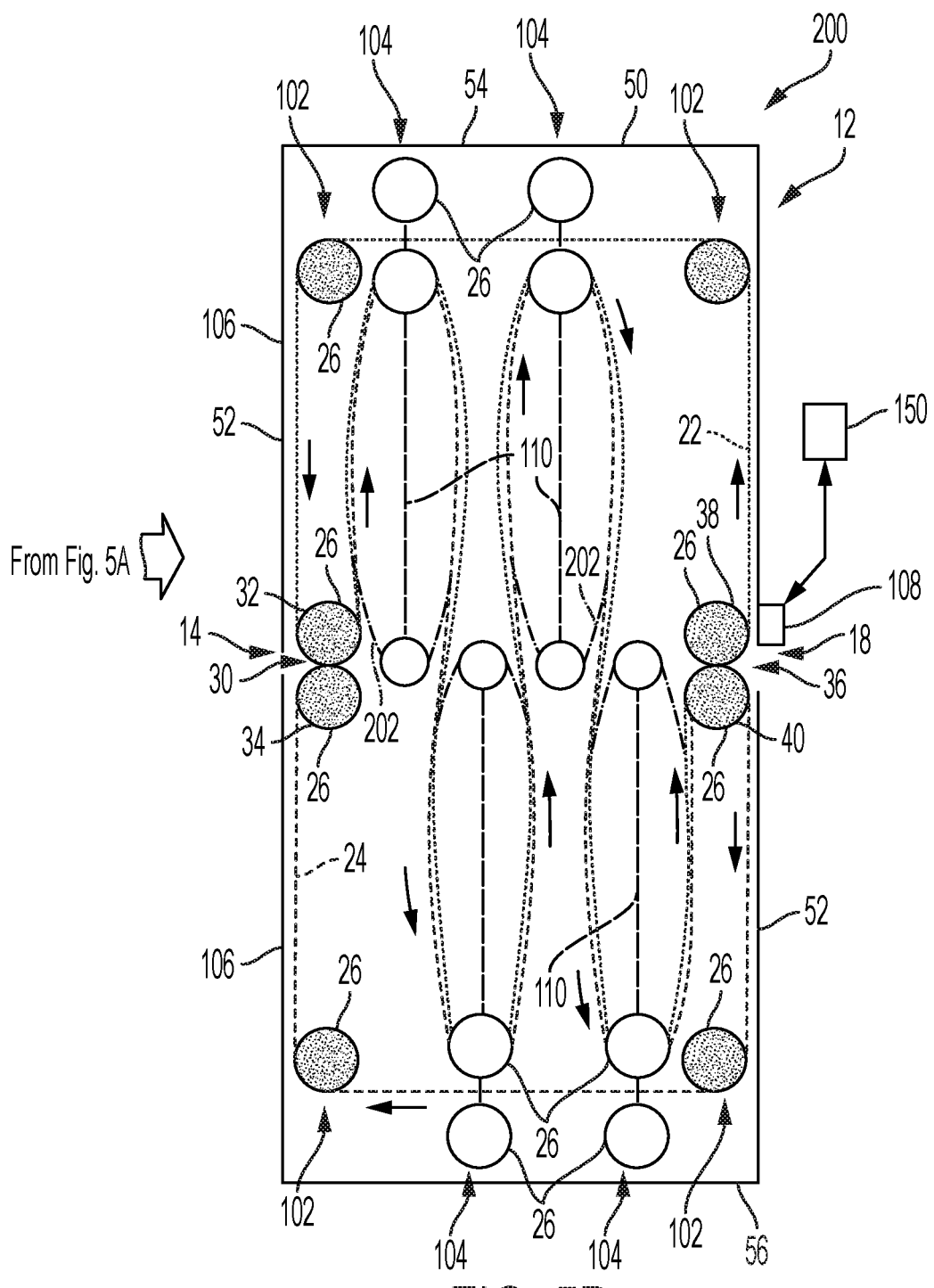

FIGS. 5A and 5B depict another exemplary pre-dryer 200 for drying an image receiving substrate 16 in preparation for a subsequent printing thereon. The pre-dryer 200 is similar to pre-dryer 100, and further includes curved guide members 202 between select belt rolls 26 that may curve the path of the porous belts 22, 24. By curving the paths of the porous belts, the curved guide members 202 may create out-of-plane tension in the belts. This additional tension helps maintain sufficient belt force on the image receiving substrate 16 to constrain motion of sandwiched sheets or web travelling between the porous belts 22, 24 in the oven.

The curved guide members 202 may be sufficiently rigid to create and maintain out-of-plane tension in the belts 22, 24 as the belts slide over the curved guide members. While not being limited to a particular configuration, the curved guide members may be curved metal or plastic sheets. The curved guide members 202 may be supported in the oven by connectors to respective rolls 26, such as the guide members coupled to roll mounts. It is understood that while not shown, tension rollers 122, 124 may also be implemented in pre-dryer 100 and 200 as described by example in greater detail above.

Figure 6:
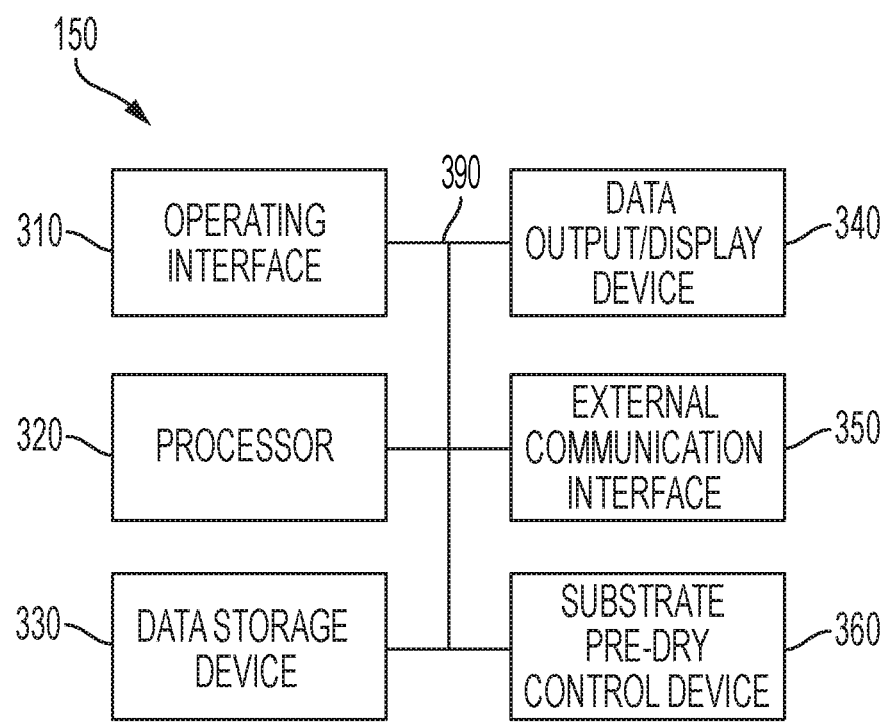
FIG. 6 illustrates a block diagram of an exemplary control system for automatic control of pre-dryers.

FIG. 6 illustrates a block diagram of the controller 150 for executing instructions to automatically control exemplary pre-dryers 10, 100, 200. The exemplary controller 150 may provide input to or be a component of a controller for executing the pre-drying process in a system such as that depicted in FIGS. 1-5B and described in greater detail below in FIG. 7.

The exemplary control system 150 may include an operating interface 310 by which a user may communicate with the exemplary control system 150. The operating interface 310 may be a locally-accessible user interface associated with the pre-dryers 10, 100, 200. The operating interface 310 may be configured as one or more conventional mechanism common to control devices and/or computing devices that may permit a user to input information to the exemplary control system 150. The operating interface 310 may include, for example, a conventional keyboard, a touchscreen with "soft" buttons or with various components for use with a compatible stylus, a microphone by which a user may provide oral commands to the exemplary control system 150 to be "translated" by a voice recognition program, or other like device by which a user may communicate specific operating instructions to the exemplary control system 150. The operating interface 310 may be a part or a function of a graphical user interface (GUI) mounted on, integral to, or associated with, the pre-dryers 10, 100, 200 with which the exemplary control system 150 is associated.

The exemplary control system 150 may include one or more local processors 320 for individually operating the exemplary control system 150 and for carrying into effect control and operating functions for pre-drying preprinted image receiving substrates, including heating, processing, speed adjustment and belt roll shifting schemes with the pre-dryers 10, 100, 200 with which the exemplary control system 150 may be associated. Processor(s) 320 may include at least one conventional processor or microprocessor that interpret and execute instructions to direct specific functioning of the exemplary control system 150, and control of the pre-drying process with the exemplary control system 150.

The exemplary control system 150 may include one or more data storage devices 330. Such data storage device(s) 330 may be used to store data or operating programs to be used by the exemplary control system 150, and specifically the processor(s) 320. Data storage device(s) 330 may be used to store information regarding, for example, location of belt rolls 26, sandwiched path lengths 28 and image receiving substrate moisture content for pre-drying image receiving substrates with which the pre-dryers 10, 100, 200 are associated. Stored belt roll location and image receiving substrate moisture content may be devolved into data for optimal drying of image receiving substrates in the manner generally described by examples herein.

The data storage device(s) 330 may include a random access memory (RAM) or another type of dynamic storage device that is capable of storing updatable database information, and for separately storing instructions for execution of pre-drying operations by, for example, processor(s) 320. Data storage device(s) 330 may also include a read-only memory (ROM), which may include a conventional ROM device or another type of static storage device that stores static information and instructions for processor(s) 320. Further, the data storage device(s) 330 may be integral to the exemplary control system 150, or may be provided external to, and in wired or wireless communication with, the exemplary control system 150, including as cloud-based data storage components.

The exemplary control system 150 may include at least one data output/display device 340, which may be configured as one or more conventional mechanism that output information to a user, including, but not limited to, a display screen on a GUI of the pre-dryers 10, 100, 200 or associated image forming device with which the exemplary control system 150 may be associated. The data output/display device 340 may be used to indicate to a user a status of a pre-drying operation effected by pre-dryers 10, 100, 200 with which the exemplary control system 150 may be associated including an operation of one or more individually controlled components at one or more of a plurality of separate pre-dryer processing stations or subsystems associated with the pre-dryers.

The exemplary control system 150 may include one or more separate external communication interfaces 350 by which the exemplary control system 150 may communicate with components that may be external to the exemplary control system such as a printer or other image forming device. At least one of the external communication interfaces 350 may be configured as an input port to support connecting an external CAD/CAM device storing modeling information for execution of the control functions in the pre-drying operations. Any suitable data connection to provide wired or wireless communication between the exemplary control system 150 and external and/or associated components is contemplated to be encompassed by the depicted external communication interface 350.

The exemplary control system 150 may include a substrate pre-dry control device 360 that may be used to control the pre-drying process on the image receiving substrate 16 (e.g., oven, porous belts 22, 24, belt rolls 26, heat source, sensors 108) to produce the dried substrates 20 for subsequent printing thereon. The image receiving substrate 16 may be fed through the oven 12 to remove moisture from the substrate under the control of the pre-dry control device 360. Dried image receiving substrates 20 may exit the oven ready for a printing thereon with subsequent drying/fusing of marking material minimized due to the pre-drying of the substrate before the printing. The substrate pre-dry control device 360 may operate as a part or a function of the processor 320 coupled to one or more of the data storage devices 330, or may operate as a separate stand-alone component module or circuit in the exemplary control system 150.

All of the various components of the exemplary control system 150, as depicted in FIG. 6, may be connected internally, and to one or more pre-dryers 10, 100, 200, associated image forming devices downstream the pre-dryers and/or components thereof, by one or more data/control busses 390. These data/control busses 390 may provide wired or wireless communication between the various components of the pre-dryers and any associated image forming devices, whether all of those components are housed integrally in, or are otherwise external and connected to pre-dryers with which the exemplary control system 150 may be associated.

It should be appreciated that, although depicted in FIG. 6 as an integral unit, the various disclosed elements of the exemplary control system 150 may be arranged in any combination of sub-systems as individual components or combinations of components, integral to a single unit, or external to, and in wired or wireless communication with the single unit of the exemplary control system. In other words, no specific configuration as an integral unit or as a support unit is to be implied by the depiction in FIG. 6. Further, although depicted as individual units for ease of understanding of the details provided in this disclosure regarding the exemplary control system 150, it should be understood that the described functions of any of the individually-depicted components, and particularly each of the depicted control devices, may be undertaken, for example, by one or more processors 320 connected to, and in communication with, one or more data storage device(s) 330.

Figure 7:
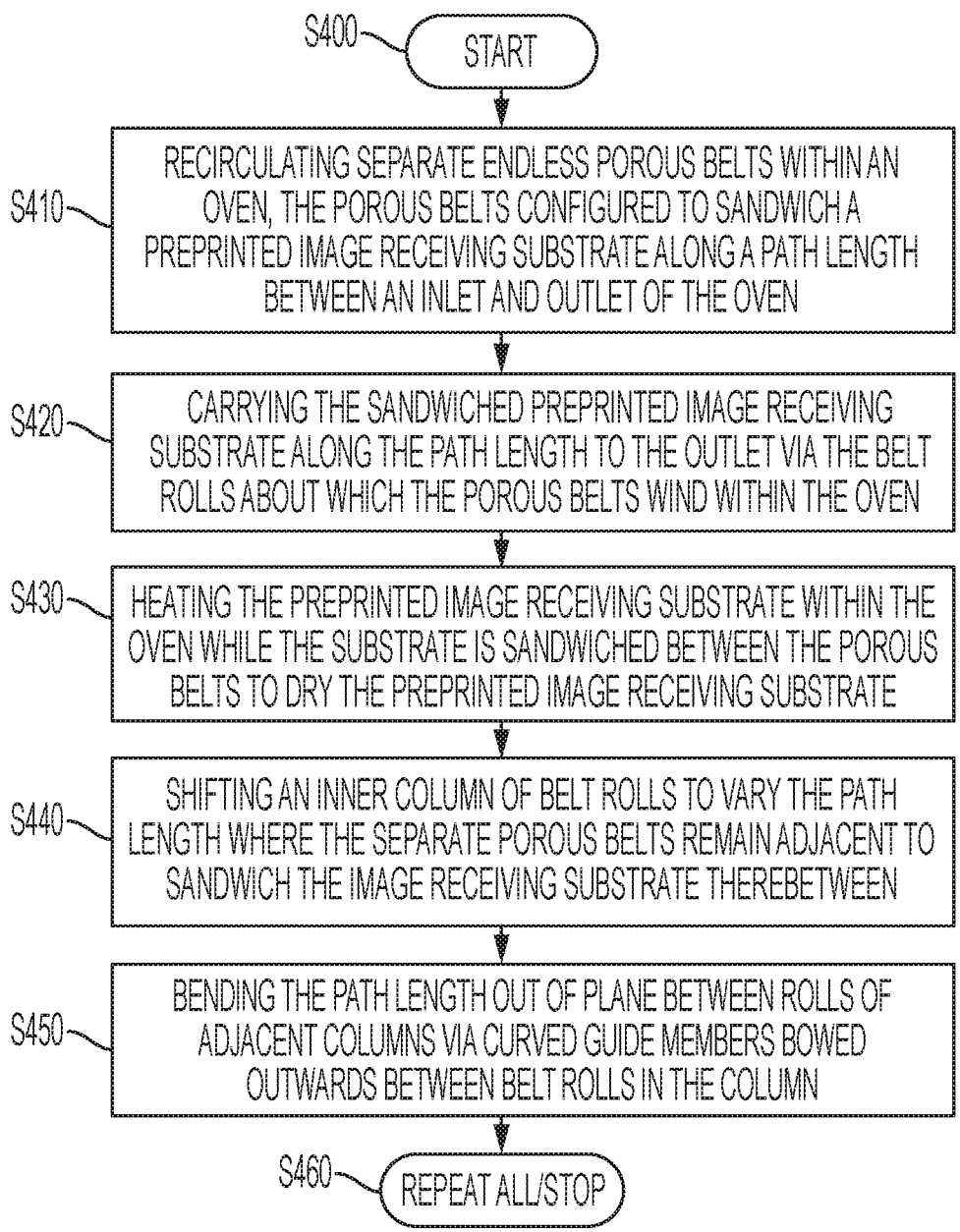
FIG. 7 is a flowchart depicting the operation of an exemplary method for pre-drying an image receiving substrate with a pre-dryer.

The disclosed embodiments may include an exemplary method for pre-drying an image receiving substrate with a pre-dryer 10, 100, 200. FIG. 7 illustrates a flowchart of such an exemplary method prior to a printing on the image receiving substrate, where the pre-drying commences at Step S400 and proceeds to Step S410.

At Step S410, separate endless porous belts are recirculated by belt rolls within an oven. The porous belts are configured to sandwich a preprinted image receiving substrate along a path length between an inlet and outlet of the oven. In particular, a first porous belt maintains contact with a first side of the preprinted image receiving substrate between the inlet and the outlet, and a second porous belt maintains contact with a second side of the preprinted image receiving substrate between the inlet and the outlet. The path length represents the length where the two separate porous belts remain adjacent to sandwich the preprinted image receiving substrate therebetween.

Operation of the method proceeds to Step S420, where the sandwiched preprinted image receiving substrate is carried along the path length to the outlet via the belt rolls about which the porous belts wind within the oven. S420 may include adding or maintaining tension to the porous belts during their recirculation. Operation of the method proceeds to Step S430.

At Step S430, the preprinted image receiving substrate is heated within the oven while the substrate is sandwiched between the porous belts to dry the preprinted image receiving substrate. Heat may be provided within the oven via a heat source in or outside the oven.

Operation of the method shown in FIG. 7 may proceed to Step S440, where an inner column of belt rolls may be shifted to vary the path length where the separate porous belts remain adjacent to sandwich the image receiving substrate therebetween. This shifting may modulate the heating time of the image receiving substrate within the oven.

Operation of the method may proceed to Step S450, where the path length where the separate porous belts remain adjacent to sandwich the image receiving substrate therebetween may be moved out of plane between belt rolls of adjacent columns via curved guide members bowed outwards between belt rolls in the column. The path length may be bent out of plane between belt rolls to increase tension of the porous belts recirculating in the oven.

Operation may repeat back to Step S410 for further pre-drying of the image receiving substrate or additional substrate sheets. Upon completion, operation may proceed to Step S460 and stop.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 7, and the accompanying description, except where any particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to disclosure.

Those skilled in the art will appreciate that other embodiments of the disclosed subject matter may be practiced with many types of image forming elements in many different configurations. For example, there are in fact many ways to heat the oven or the sheets that all fit within the scope of the present invention. Radiant heaters directly illuminating the belts are one example. Steam heated rollers and convectively circulated hot air are other examples. Similarly, there are many ways to move rollers to control the resultant sandwiched path length. Moisture and thermal sensors can be used to close control loops for the drying process. It should be understood that these are non-limiting examples of the variations that may be undertaken according to the disclosed schemes. In other words, no particular limiting configuration is to be implied from the above description and the accompanying drawings.

It will be appreciated that various of the above-disclosed and other features and functions, or alternatives thereof, may be desirably combined into many other different systems or applications. For example, when used just before a print engine of an image forming device, a substrate chiller, including cooled roller nips or belts or air knives, could be added between the pre-dryer and print engine. Heat extracted from the image receiving substrate could be recycled from the substrate chiller to the pre-dryer using a heat pipe and reduce total power needs. Also, various presently unforeseen or unanticipated alternatives, modifications, variations or improvements therein may be subsequently made by those skilled in the art.

What is claimed is:

1. A pre-dryer for drying an image receiving substrate in preparation for a subsequent printing thereon, comprising:
   an oven having an inlet through which the image receiving substrate to be dried is passed, and an outlet downstream the inlet through which the image receiving substrate exits the oven as a dried image receiving substrate;
   two separate endless porous belts recirculating within the oven and configured to sandwich the image receiving substrate along a sandwiched path length between the inlet and the outlet, with a first one of the porous belts maintaining contact with a first side of the image receiving substrate between the inlet and the outlet, and a second one of the porous belts maintaining contact with a second side of the image receiving substrate between the inlet and the outlet, the sandwiched path length representing a length where the two separate porous belts remain adjacent to sandwich the image receiving substrate therebetween; and
   a plurality of belt rolls about which the porous belts are guided within the oven, the belt rolls configured to tension the porous belts during recirculation and carry the sandwiched image receiving substrate along the sandwiched path length to the outlet,
   wherein the oven heats the porous belts and image receiving substrate within the oven while the image receiving substrate is sandwiched between the porous belts to dry the image receiving substrate to a desired level in preparation for a subsequent printing thereon.

2. The pre-dryer of claim 1, wherein the sandwiched path length is variable.

3. The pre-dryer of claim 1, wherein the plurality of belt rolls is arranged as an array of belt rolls having a plurality of columns, the plurality of columns including outer columns adjacent opposite sidewalls of the oven and at least one inner column between the outer columns.

4. The pre-dryer of claim 3, wherein the at least one inner column of belt rolls is shiftable to vary the sandwiched path length where the two separate porous belts remain adjacent to sandwich the image receiving substrate therebetween.

5. The pre-dryer of claim 4, further comprising tension rollers, each tension roller between two of the plurality of columns to keep the two separate porous belts taut.

6. The pre-dryer of claim 3, further comprising curved guide members between belt rolls in a column, the guide members bowed outwards to curve the sandwiched path length out of plane between rolls of adjacent columns and increase out of plane tension of the porous belts therebetween.

7. The pre-dryer of claim 3, wherein two belt rolls of the at least one inner column of belt rolls are adjacent and rotate in opposite directions with the porous belts rotating about and between the two belt rolls for even heating of both porous belts and the sandwiched image receiving substrate.

8. The pre-dryer of claim 1, wherein the inlet and outlet reside on opposite sides of the oven.

9. The pre-dryer of claim 1, wherein the heating is provided by dry air incident upon one side of the oven, flowing cross-wise past the sandwiched path length of the belts, and extracted on the opposite side of the oven.

10. The pre-dryer of claim 9, wherein the hot moist air extracted from the oven is dehumidified and returned to the oven as relatively dry air.

11. The pre-dryer of claim 1, wherein the heat source is at least one of the plurality of belt rolls as a heated belt roll.

12. The pre-dryer of claim 11, wherein the at least one heated belt roll is internally heated via superheated steam.

13. The pre-dryer of claim 12, wherein the at least one heated belt roll is porous, and the superheated steam evolves through the at least one heated belt roll to the sandwiched image receiving substrate.

14. The pre-dryer of claim 1, wherein the pre-dryer is in an image forming device.

15. A method for pre-drying an image receiving substrate with a pre-dryer including an oven, separate endless porous belts and a plurality of belt rolls about which the porous belts are guided within the oven, the oven having an inlet through which the image receiving substrate to be dried is passed, and an outlet downstream the inlet through which the image receiving substrate exits the oven as a dried image receiving substrate, the method comprising:
recirculating the two separate endless porous belts within the oven while sandwiching the image receiving substrate along a sandwiched path length between the inlet and the outlet, with the first one of the porous belts maintaining contact with the first side of the image receiving substrate between the inlet and the outlet, and the second one of the porous belts maintaining contact with the second side of the image receiving substrate between the inlet and the outlet, the sandwiched path length representing the length where the two separate porous belts remain adjacent to sandwich the image receiving substrate therebetween;
carrying the sandwiched image receiving substrate along the sandwiched path length to the outlet via the plurality of belt rolls about which the porous belts wind within the oven, the belt rolls configured to tension the porous belts during the recirculating step; and
heating the porous belts and image receiving substrate within the oven while the image receiving substrate is sandwiched between the porous belts with a heat source to dry the image receiving substrate to a desired level in preparation for a subsequent printing thereon.

16. The method of claim 15, wherein the plurality of belt rolls are arranged as an array of belt rolls having a plurality of columns, the plurality of columns including outer columns adjacent opposite sidewalls of the oven and at least one inner column between the outer columns, and further comprising modulating the heating time of the image receiving substrate within the oven by shifting the at least one inner column of belt rolls and varying the sandwiched path length where the two separate porous belts remain adjacent to sandwich the image receiving substrate therebetween.

17. The method of claim 15, further comprising bending the sandwiched path length out of plane between rolls of adjacent columns and increasing out of plane tension of the porous belts therebetween via curved guide members bowed outwards between belt rolls in the column.

18. A pre-dryer for drying an image receiving substrate in preparation for a subsequent printing thereon, comprising:
two separate endless porous belts recirculating within an oven having an inlet through which the image receiving substrate to be dried is passed and an outlet downstream the inlet through which the image receiving substrate exits the oven as a dried image receiving substrate, the porous belts configured to sandwich the image receiving substrate along a sandwiched path length between the inlet and the outlet, with a first one of the porous belts maintaining contact with a first side of the image receiving substrate between the inlet and the outlet, and a second one of the porous belts maintaining contact with a second side of the image receiving substrate between the inlet and the outlet, the sandwiched path length representing a length where the two separate porous belts remain adjacent to sandwich the image receiving substrate therebetween; and
a plurality of belt rolls about which the porous belts wind within the oven, the belt rolls configured to tension the porous belts during recirculation and carry the sandwiched image receiving substrate along the sandwiched path length to the outlet,
wherein the plurality of belt rolls are arranged as an array of belt rolls having a plurality of columns, the plurality of columns including outer columns adjacent opposite sidewalls of the oven and at least one inner column between the outer columns, the porous belts and image receiving substrate heated within the oven while the image receiving substrate is sandwiched between the porous belts to dry the image receiving substrate to a desired level in preparation for a subsequent printing thereon.

19. The pre-dryer of claim 18, wherein the at least one inner column of belt rolls is shiftable to vary the sandwiched path length where the two separate porous belts remain adjacent to sandwich the image receiving substrate therebetween, and the recirculating endless porous belts are expandable in association with shifting of the at least one inner column of belt rolls.

20. The pre-dryer of claim 18, wherein two belt rolls of the at least one inner column of belt rolls are adjacent and rotate in opposite directions with the porous belts rotating about and between the two belt rolls for even heating of both porous belts and the sandwiched image receiving substrate.

* * * * *